(12) United States Patent
Rasmussen et al.

(10) Patent No.: US 7,749,663 B2
(45) Date of Patent: Jul. 6, 2010

(54) METHOD FOR ADJUSTING DIMENSIONS OF PHOTOMASK FEATURES

(75) Inventors: Robert T. Rasmussen, Boise, ID (US);
Jim R. Baugh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 433 days.

(21) Appl. No.: 11/516,234

(22) Filed: Sep. 6, 2006

(65) Prior Publication Data

US 2007/0003844 A1  Jan. 4, 2007

Related U.S. Application Data

(63) Continuation of application No. 10/732,608, filed on Dec. 10, 2003, now Pat. No. 7,186,480.

(51) Int. Cl.
*G03F 1/00* (2006.01)

(52) U.S. Cl. .......................................................... 430/5

(58) Field of Classification Search .................... 430/5, 430/322, 323, 324; 216/92
See application file for complete search history.

(56) References Cited

U.S. PATENT DOCUMENTS

| | | | |
|---|---|---|---|
| 4,747,907 A | 5/1988 | Acocella et al. | |
| 5,482,802 A * | 1/1996 | Celler et al. | 430/5 |
| 5,965,301 A * | 10/1999 | Nara et al. | 430/5 |
| 6,436,723 B1 | 8/2002 | Tomita et al. | |
| 6,492,069 B1 * | 12/2002 | Wu et al. | 430/5 |
| 6,503,852 B1 | 1/2003 | Hosono et al. | |
| 2002/0160274 A1 | 10/2002 | Buxbaum et al. | |
| 2003/0025216 A1 | 2/2003 | Inazuki et al. | |
| 2003/0228047 A1 * | 12/2003 | Chou et al. | 382/144 |

FOREIGN PATENT DOCUMENTS

| | | |
|---|---|---|
| WO | WO 87/06027 | 10/1987 |
| WO | WO 03/010601 A1 | 2/2003 |

OTHER PUBLICATIONS

Buie et al., "Chrome Etch for <0.13 um Advanced Reticle Production," Applied Materials Photomask Etch, Sunnyvale, CA., date unknown, pp. 1-8.
"Etching (microfabrication)" Wikipedia, <<http://en.wipkipedia.org/wiki/Etching_(microfabrication)#Wet_etching>>, 5 pages, accessed Oct. 7, 2009.

* cited by examiner

*Primary Examiner*—Stephen Rosasco
(74) *Attorney, Agent, or Firm*—TraskBritt

(57) ABSTRACT

A method for adjusting one or more dimensions of a photomask subsequent to etching of a defective pattern in the chrome-containing layer thereof is provided. The method includes subjecting the chrome-containing layer of a photomask to a wet etch process utilizing a solution comprising deionized water and ozone. The length of exposure is directly proportional to the degree of adjustment desired. Accordingly, the method of the present invention provides a way in which dimensions of a photomask may be adjusted by a small amount (e.g., a few angstroms) or more severely adjusted, for example, by 20-30 nanometers or more.

11 Claims, 6 Drawing Sheets

US 7,749,663 B2

METHOD FOR ADJUSTING DIMENSIONS OF PHOTOMASK FEATURES

CROSS-REFERENCE TO RELATED APPLICATION

This application is a continuation of application Ser. No. 10/732,608, filed Dec. 10, 2003, now U.S. Pat. No. 7,186,480, issued Mar. 6, 2007.

BACKGROUND OF THE INVENTION

1. Field of the Invention

The present invention relates generally to the fabrication of photomasks from which patterns may be transferred to semiconductor device structures. More particularly, the present invention relates to a method for adjusting dimensions of photomask features, such as so-called "critical dimensions," subsequent to etching a desired pattern therein and prior to utilizing the photomask to transfer the desired pattern to a semiconductor substrate.

2. State of the Art

Reticles, or photomasks, are often used in the semiconductor industry as templates for creating desired patterns in semiconductor substrates. Photomasks are typically comprised of a silicon oxide-containing substrate (e.g., glass or quartz) having a chrome-containing layer on one side thereof in which a pattern is etched. When aligned with a surface of a semiconductor substrate (conventionally with a layer of photoresist material therebetween), photomasks may be used to transfer the pattern from the photomask to the surface of the semiconductor substrate. Photomasks are typically used in place of directly writing the desired pattern on the semiconductor substrate as a substantial amount of time and expense may be saved by blanket processing through a photomask.

A photomask may be fabricated using a number of different techniques, depending upon the method of pattern writing utilized. Due to the dimensional requirements of modern semiconductor structures, writing of features on a photomask is typically conducted with a laser or electron beam. A typical process for fabricating a photomask is illustrated in FIGS. 1A-1D. It should be understood by those of ordinary skill in the art that the methods and structures described herein do not form a complete process for manufacturing photomasks. The remainder of the process is known to those of ordinary skill in the art and, therefore, only the process steps and structures necessary to understand the typical fabrication process are described herein.

Referring to FIG. 1A, a cross-sectional view of an intermediate structure 10 in the fabrication of a photomask 20 (see, FIG. 1D) having a pattern etched in the chrome-containing layer 14 thereof is illustrated. The intermediate structure 10 includes a chrome-containing layer 14 which resides on a silicon oxide-containing substrate 12, such as a glass or quartz plate. The figures presented in conjunction with this description are not meant to be actual cross-sectional views of any particular portion of an actual prior art photomask, but are merely idealized representations which are employed to more clearly and fully depict the process of the prior art than would otherwise be possible. Elements common between the figures maintain the same numeric designation.

An antireflective coating (ARC) layer 16 is disposed over the chrome-containing layer 14. The ARC layer 16 may be an inorganic ARC layer formed, for instance, from chrome oxynitride, titanium nitride, or silicon nitride; an organic ARC layer formed, for instance, from poly(vinyl pyridine), or polyimide; or a combination of inorganic and organic materials. A photoresist layer 18, formed from a conventional photoresist material, is disposed atop the ARC layer 16.

As shown in FIG. 1B, after formation of the intermediate structure 10, a desired pattern of features is directly written on the photoresist layer 18 (e.g., using a laser or electron beam) and the pattern is developed into the photoresist layer 18, creating a patterned photoresist layer 18'. The patterned photoresist layer 18' is subsequently etched to extend the pattern into the unprotected portions of the ARC layer 16 and the chrome-containing layer 14, as shown in FIG. 1C. Etching processes are known to those of ordinary skill in the art and may include, without limitation, reactive ion etching (RIE). As shown in FIG. 1D, the patterned photoresist layer 18' may subsequently be removed by a conventional process (such as a wet- or dry-strip process, a tape lift-off technique, or combinations thereof). Thus, a photomask 20 having a desired pattern in the chrome-containing layer 14 thereof is fabricated. The ARC layer 16 typically remains over the chrome-containing layer 14 to reduce reflection and make any defects that may be present more visible, such potential defects being more fully described below.

For a variety of reasons, some photoresist layers used to fabricate photomasks according to the above process, as well as other conventional processes, may contain defective patterns. For instance, referring to FIG. 2A, undeveloped areas may occur at the base of the patterned photoresist layer 18' causing the presence of a foot or feet 22. Feet are thought to be caused by the neutralization of an acid in the patterned photoresist layer 18' by the basicity of the underlying ARC layer 16. Further, t-topping may occur wherein a portion of the photoresist material 24 at or near the top surface 26 of the patterned photoresist layer 18' extends further than desired in the lateral direction. T-topping is believed to be caused by surface contamination of the photoresist material 24 during processing prior to developing the pattern into the patterned photoresist layer 18'. Still further, standing waves 28 may occur on the sidewalls 30 of the patterned photoresist layer 18' due, it is thought, to reflectivity of the underlying chrome-containing layer 14 during the writing process, despite the presence of the ARC layer 16.

As shown in FIG. 2B, if a patterned photoresist layer 18' having a defective pattern is used to fabricate a photomask 20, the defective pattern will be transferred to the photomask 20 and may, accordingly, affect one or more critical dimensions thereof. A "critical dimension" in a photomask is the size of any feature of the photomask which is critical to performance of a semiconductor device patterned through the photomask. Often, but not always, the critical dimension is the size of the smallest feature on the photomask. Typically there is some tolerance, i.e., differing upper and lower limits, for the allowable size of a particular critical dimension. However, such tolerances are generally rather narrow. In the intermediate structure 32 of FIG. 2B, the critical dimension is shown to be the lateral width of line 34, such lateral width designated as "x". However, if one were to etch through the patterned photoresist layer 18' of FIG. 2B, which contains a defective pattern, the lateral width of line 34 would instead be represented by "x'", which is less than "x" and may be outside of the critical dimension tolerance. In a case such as this, the resulting photomask 20 conventionally must be discarded as it does not meet the critical dimension requirements. As is apparent, this results in a significant cost.

Methods for fabricating photomasks having critical dimensions within the critical dimension tolerance, despite defects in patterned photoresist layers, have been proposed. For example, U.S. Patent Publication No. US 2002/0160274 discloses a method for improving control over the dimensions of the patterned photoresist by treating the patterned photoresist with an etchant plasma to reshape the surface thereof prior to etching through the photoresist to the chrome-containing layer. However, the inventors hereof are unaware of any methods for adjusting critical dimensions of a photomask once a defect has been extended to the chrome-containing layer thereof.

BRIEF SUMMARY OF THE INVENTION

The present invention, in one embodiment, includes a method for adjusting one or more dimensions of a photomask subsequent to etching of a defective pattern in the chrome-containing layer thereof. The method provides a way in which dimensions of a photomask may be adjusted by a small amount (e.g., a few angstroms) to more closely achieve a desired value, for example, of a critical dimension, even if the dimension in question is within the critical dimension tolerance without the adjustment. The method also provides a way in which photomasks previously thought to be unsalvageable and which were, accordingly, routinely discarded, may be salvaged by more severely adjusting one or more dimensions thereof, for example, by 20-30 nanometers, or more. Such adjustments may result in a potentially substantial cost savings.

An exemplary embodiment of a method incorporating teachings of the present invention includes subjecting the chrome-containing layer of a photomask to a wet etch process utilizing a solution comprising deionized water and ozone. The length of exposure is directly proportional to the degree of adjustment desired. That is, if a small adjustment in one or more dimensions of a photomask is desired, the photomask may be exposed to the deionized water and ozone solution for only a few moments, whereas if a large adjustment is necessary, the photomask may be exposed to the solution for several hours.

Other features and advantages of the present invention will become apparent to those of ordinary skill in the art through consideration of the ensuing description, the accompanying drawings and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

The present invention is directed to a method for adjusting dimensions, such as critical dimensions, of photomasks subsequent to etching of a defective pattern in the chrome-containing layer thereof. The method provides a way in which photomasks previously thought to be unsalvageable and which were, accordingly, routinely discarded, may be salvaged, resulting in a potentially substantial cost savings. The particular embodiments described herein are intended in all respects to be illustrative rather than restrictive. Other and further embodiments will become apparent to those of ordinary skill in the art to which the present invention pertains without departing from its scope.

FIGS. 3A through 3E illustrate various views of a method according to the present invention for forming a photomask 116 having the necessary critical dimensions despite utilization of a photoresist layer 108' having a defective pattern therein, the term "defective pattern" as used herein meaning a pattern of features exhibiting at least one defect. It should be understood and appreciated that the methods and structures described herein do not form a complete process for manufacturing photomasks. The remainder of the process is known to those of ordinary skill in the art and, therefore, only the process steps and structures necessary to understand the present invention are described herein.

It should be further understood that while in the method depicted in FIGS. 3A through 3E the defect in the photoresist layer is a foot 112 of undeveloped photoresist material present proximate the interface between the patterned photoresist layer 108' and the underlying antireflective coating (ARC) layer 106, the exemplary method is equally applicable to a patterned photoresist layer 108' having a different type of defect including, without limitation, a patterned photoresist layer 108' exhibiting t-topping or standing waves on the sidewalls of lines etched therein.

Figure 1A:
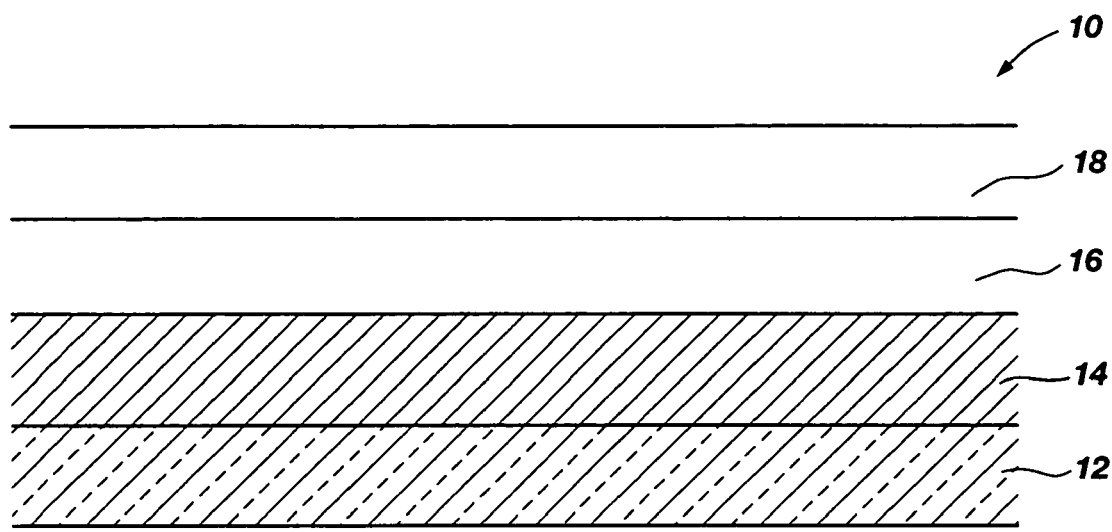
FIGS. 1A through 1D are side cross-sectional views schematically illustrating a prior art method of fabricating a photomask.
Figure 1B:
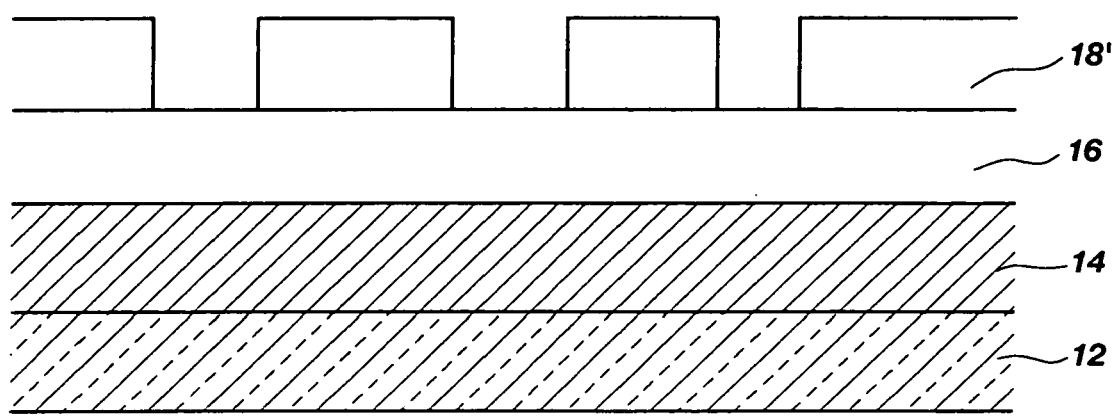
Figure 1C:
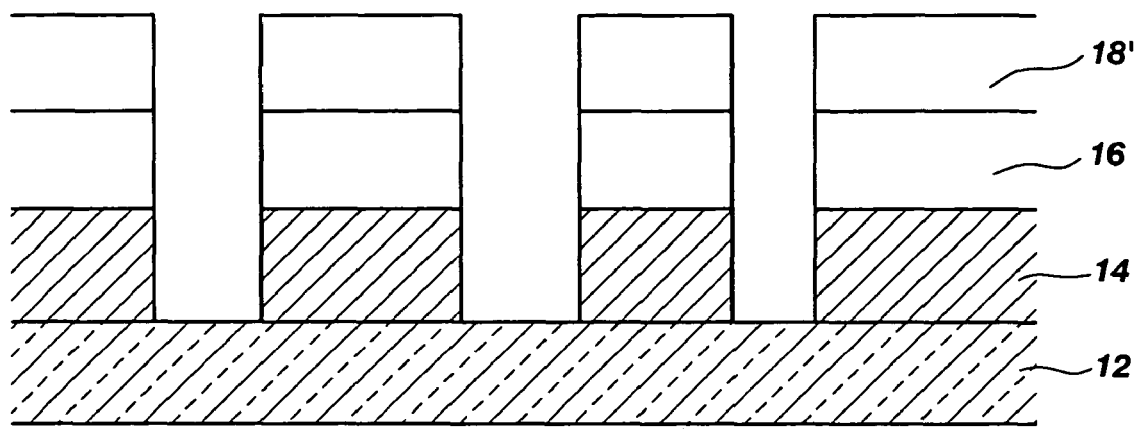
Figure 1D:
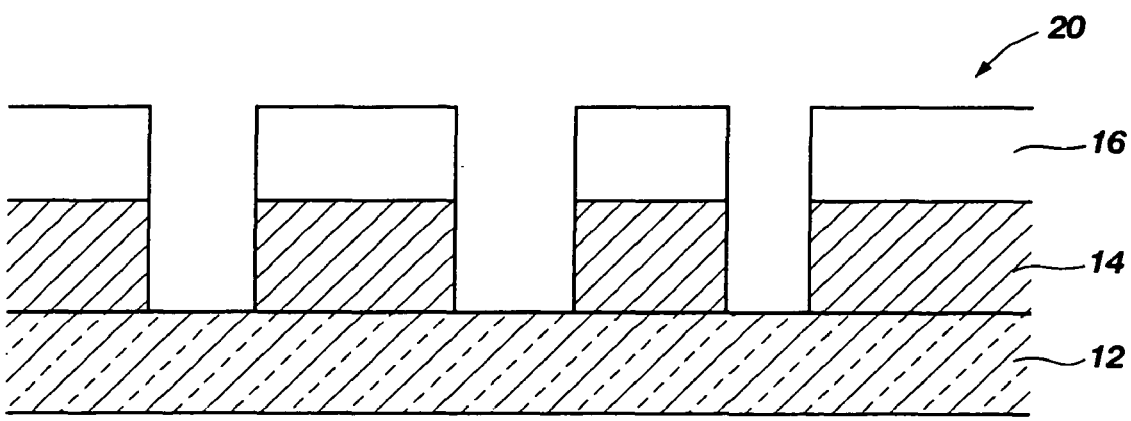
Figure 2A:
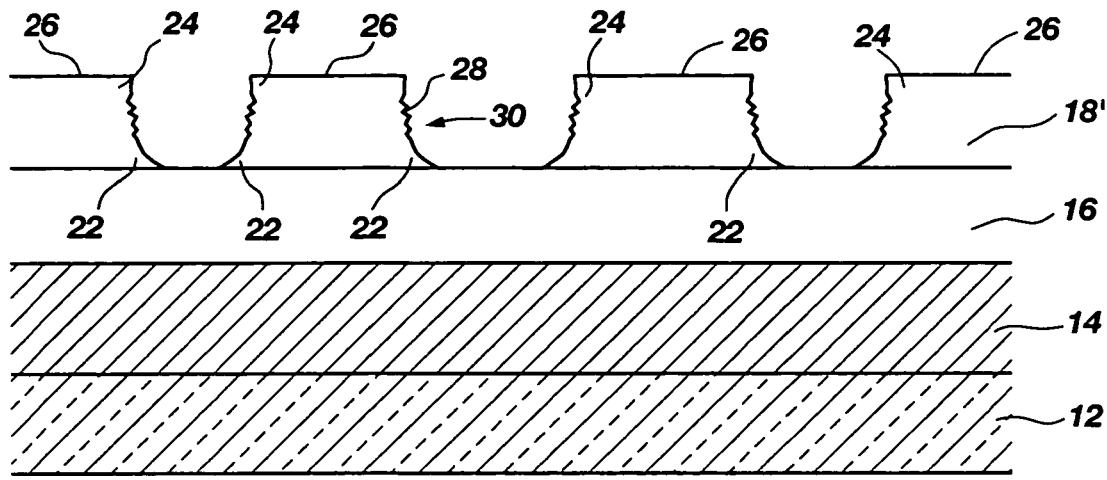
FIG. 2A is a side cross-sectional view of an intermediate structure in the fabrication of a prior art photomask having a photoresist layer with a defective pattern therein.
Figure 2B:
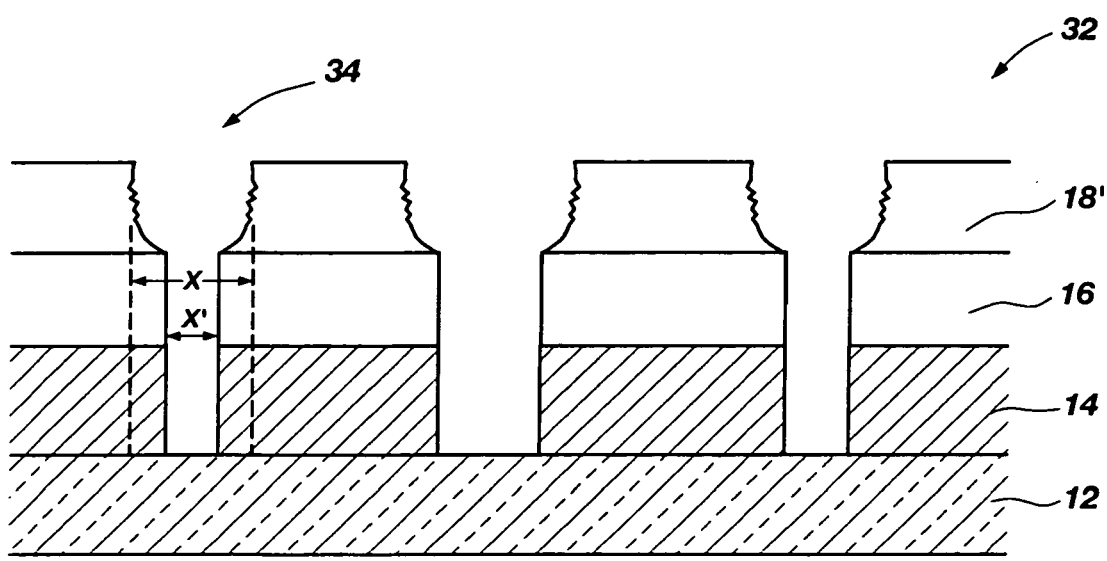
FIG. 2B is a side cross-sectional view of the intermediate structure of FIG. 2A after the defective pattern of the photoresist layer has been transferred to the antireflective coating layer and the chrome-containing layer thereof.
Figure 3A:
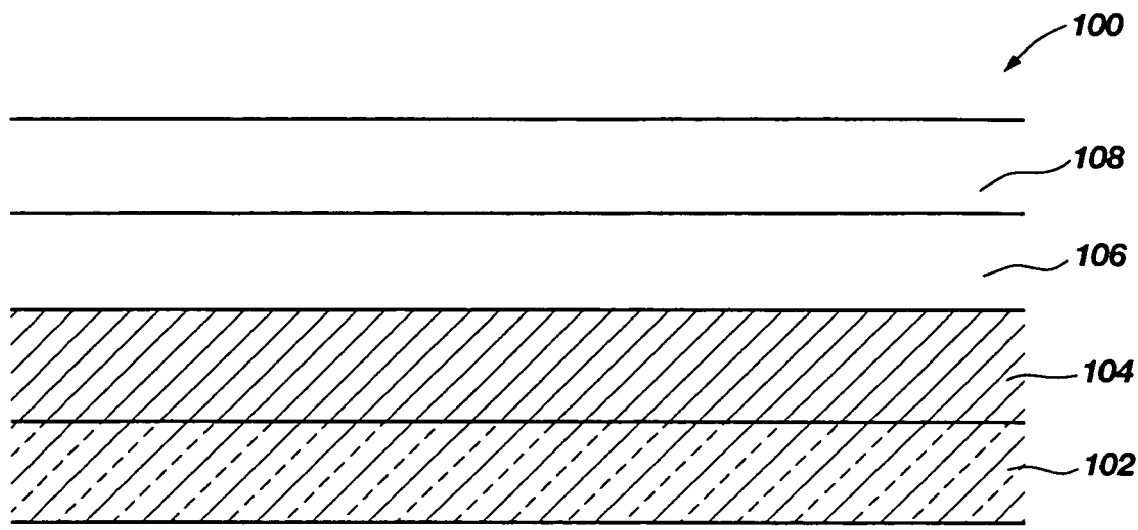
FIGS. 3A through 3E are side cross-sectional views schematically illustrating a method of fabricating a photomask in accordance with the present invention.

With initial reference to FIG. 3A, a cross-sectional view of an intermediate structure 100 in the fabrication of a photomask 114' (see, FIG. 3E) having the necessary critical dimension despite being formed from a patterned photoresist layer 108' having a defect therein is illustrated. The figures presented in conjunction with this description are not meant to be actual cross-sectional views of any particular portion of an actual photomask, but are merely idealized representations which are employed to more clearly and fully depict the method of the invention than would otherwise be possible. Elements common between the figures maintain the same numeric designation. Further, it should be understood that while the depicted method illustrates formation of a photomask 114' having only a single critical dimension, the method may also be applied to photomasks having multiple critical dimensions.

The intermediate structure 100 includes a chrome-containing layer 104 which resides on a silicon oxide-containing substrate 102. By way of example and not limitation, the silicon oxide-containing substrate 102 may comprise a quartz plate, e.g., a fluorinated quartz plate, or a glass plate, e.g., a borosilicate glass or soda-lime glass plate. As is understood by those of ordinary skill in the art, the upper surface of the chrome-containing layer 104 may be oxidized to form chrome oxide but the layer 104 will be predominantly chrome. An antireflective coating (ARC) layer 106 is disposed over the chrome-containing layer 104. The ARC layer 106 may be an inorganic ARC layer formed, for instance, from chrome oxynitride, titanium nitride, or silicon nitride; an organic ARC layer formed, for instance, from poly(vinyl pyridine), or polyimide; or a combination of inorganic and organic materials. It is currently preferred that the ARC layer 106 be formed from chrome oxynitride. It will be understood that if the upper surface of the chrome-containing layer 104 is oxidized to form chrome oxide, such chrome oxide layer may serve as the ARC layer 106. A photoresist layer 108, formed from a conventional photoresist material, is disposed atop the ARC layer 106.

Figure 3B:
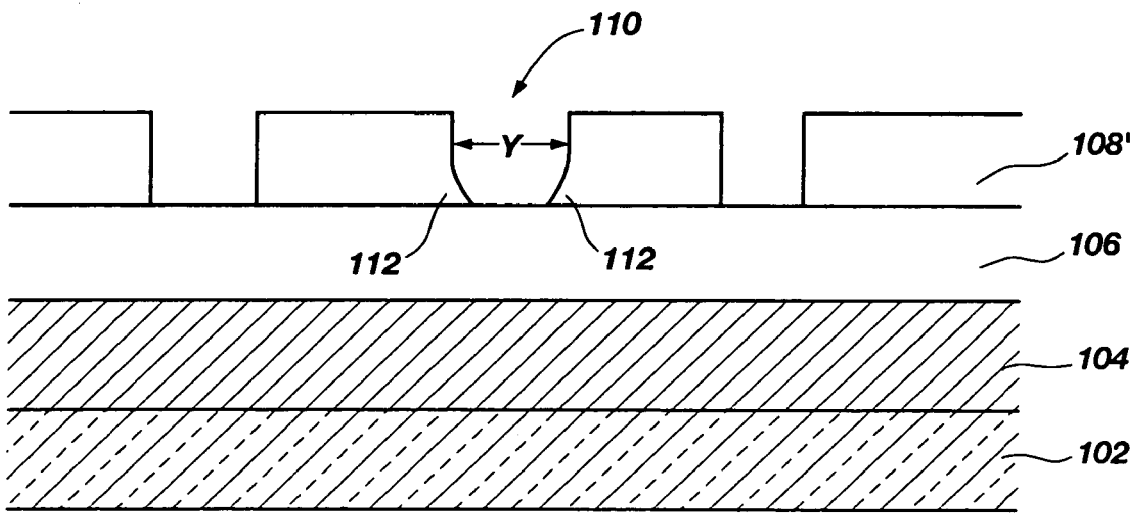

As shown in FIG. 3B, after formation of the intermediate structure 100, a desired pattern of lines may be directly written on the photoresist layer 108 (e.g., using a laser or electron beam) and the pattern may be developed into the photoresist layer 108 to create a patterned photoresist layer 108'. In FIG. 3B, substantially vertical line 110 represents a feature having a critical dimension for the photomask 114, the critical dimension indicated by "Y." However, the patterned photoresist layer 108' contains a defect wherein undeveloped areas of photoresist material (i.e., feet 112) are present in substantially vertical line 110 at the base of the patterned photoresist layer 108' proximate its interface with the ARC layer 106. As mentioned in the Background of the Invention, such areas of undeveloped photoresist material or feet 112 are thought to be caused by the neutralization of an acid in the patterned photoresist layer 108' by the basicity of the underlying ARC layer 106.

Figure 3C:
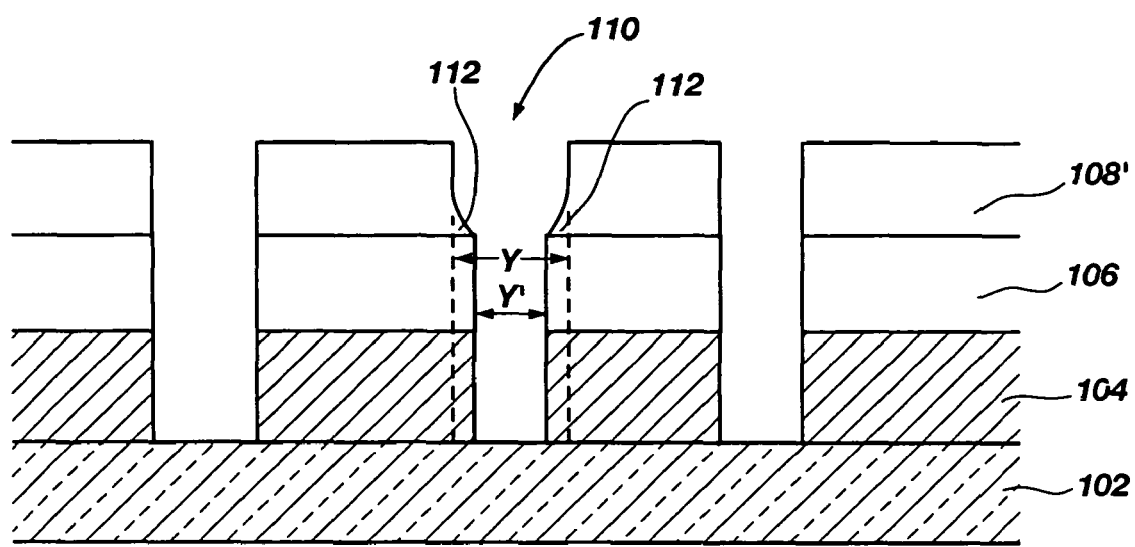
Figure 3D:
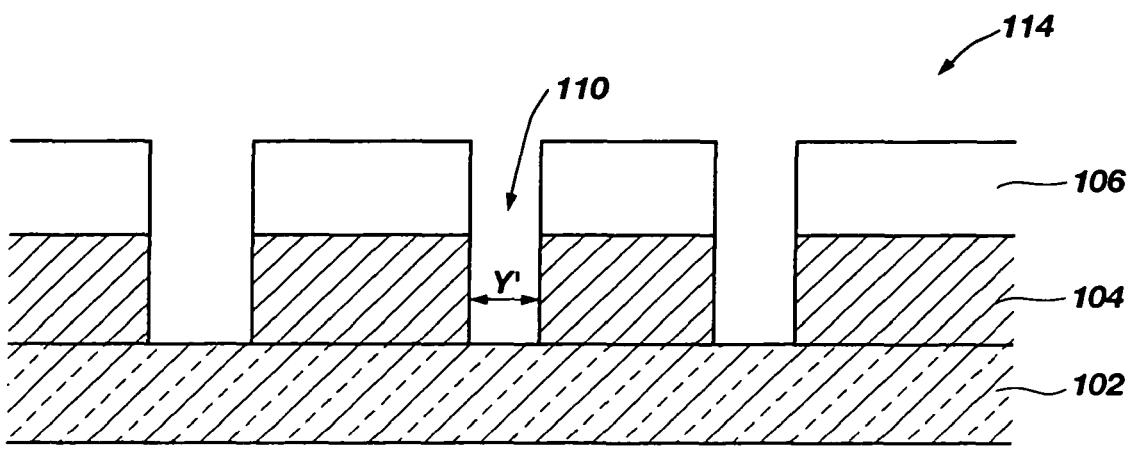

Subsequent to developing the pattern into the photoresist layer 108, the patterned photoresist layer 108' is etched to extend the pattern into the ARC layer 106 and the chrome-containing layer 104. This step is shown in FIG. 3C. Etching processes are known to those of ordinary skill in the art and may include, without limitation, reactive ion etching (RIE). As is evident from FIG. 3C, due to etching through the defective patterned photoresist layer 108', the lateral width of substantially vertical line 110 after etching is represented by "Y'." However, the critical dimension of substantially vertical line 110 is represented in dotted lines by "Y," the lateral width that substantially vertical line 110 would have in the absence of the undeveloped photoresist material or feet 112. When the patterned photoresist layer 108' is removed in a subsequent processing step (e.g., by a wet- or dry-strip process, a tape lift-off technique, or combinations thereof), a photomask 114 results which includes a lateral width "Y'" of the substantially vertical line 110 in the chrome-containing layer 104 thereof, as well as in the ARC layer 106, that is less than the critical dimension "Y" of the substantially vertical line 110.

To adjust the dimension of substantially vertical line 110 into the critical dimension tolerance in accordance with the present invention, the photomask 114 may be subjected to a wet etch process using deionized water and ozone ($O_3$). To accomplish this, the photomask 114 may be placed into a container containing a solution of deionized water and ozone. The solution may be formed by diffusing ozone through deionized water using a diffuser plate. Ozone is more soluble in water at lower temperatures and is degraded at higher temperatures. Therefore, more ozone may be saturated in the water by keeping the temperature of the deionized water relatively low. It is currently preferred that the deionized water be kept at a temperature of about 20.0° C. to 30.0° C. during the wet etch process. It is currently more preferred that the temperature of the deionized water be about 23.5° C. Further, it is currently preferred that the concentration of ozone diffused through the water be about 30 to 35 mg/L, more preferably about 30 to 32 mg/L.

Figure 3E:
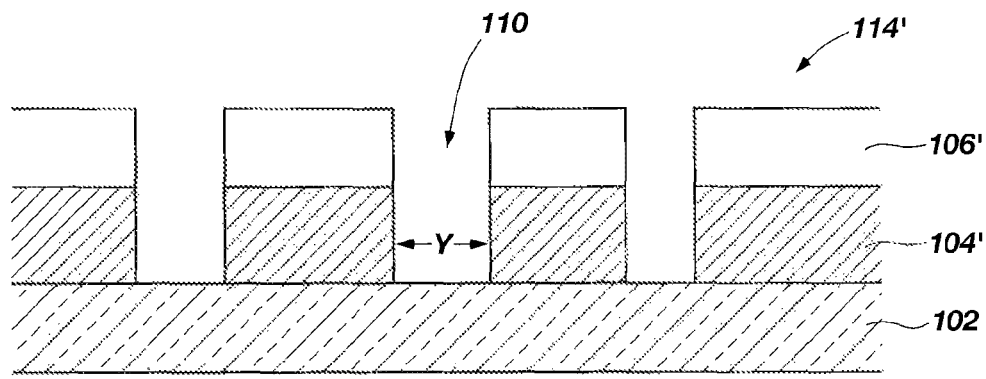

The wet etch process of the present invention provides a method for removing portions of the material from the chrome-containing layer 104 of the photomask 114, as well as from the ARC layer 106, substantially uniformly at a rate of approximately $1.50 \times 10^{-4}$ to $2.10 \times 10^{-4}$ microns/minute. More particularly, the material may be substantially uniformly removed from the chrome-containing layer 104 of the photomask 114, and from the ARC layer 106, at a rate of approximately $1.60 \times 10^{-4}$ to $1.90 \times 10^{-4}$ microns/minute. Thus, the amount of material removed from the chrome-containing layer 104 (and the ARC layer 106) of the photomask 114 is directly proportional to the amount of time the photomask 114 is exposed to the deionized water and ozone solution. Accordingly, to effect a larger adjustment in the lateral dimension of the substantially vertical line 110, the photomask 114 may be exposed to the etchant solution for a period of time relatively longer than the time to effect a smaller adjustment. As shown in FIG. 3E, the substantially vertical line 110 of the resultant adjusted photomask 114' includes a lateral width of "Y'''," which is larger than "Y'" (FIG. 3D) and, according to the illustrated example, is within the critical dimension tolerance thereof.

While in the illustrated embodiment the critical dimension is the lateral dimension of the substantially vertical line 110, the method hereof may also be used to remove material from the chrome-containing layer 104 in the vertical direction and, thus, can similarly adjust dimensions in the vertical direction if, for instance, a lateral line (not shown) is desired. Further, while in the illustrated embodiment, one or more lines 110 having a critical dimension are defined by those portions of the chrome-containing layer 104 which are removed from the photomask 116, the method of the present invention may also be used to define structures formed from the material of the chrome-containing layer 104 which themselves have a critical dimension.

Figure 4:
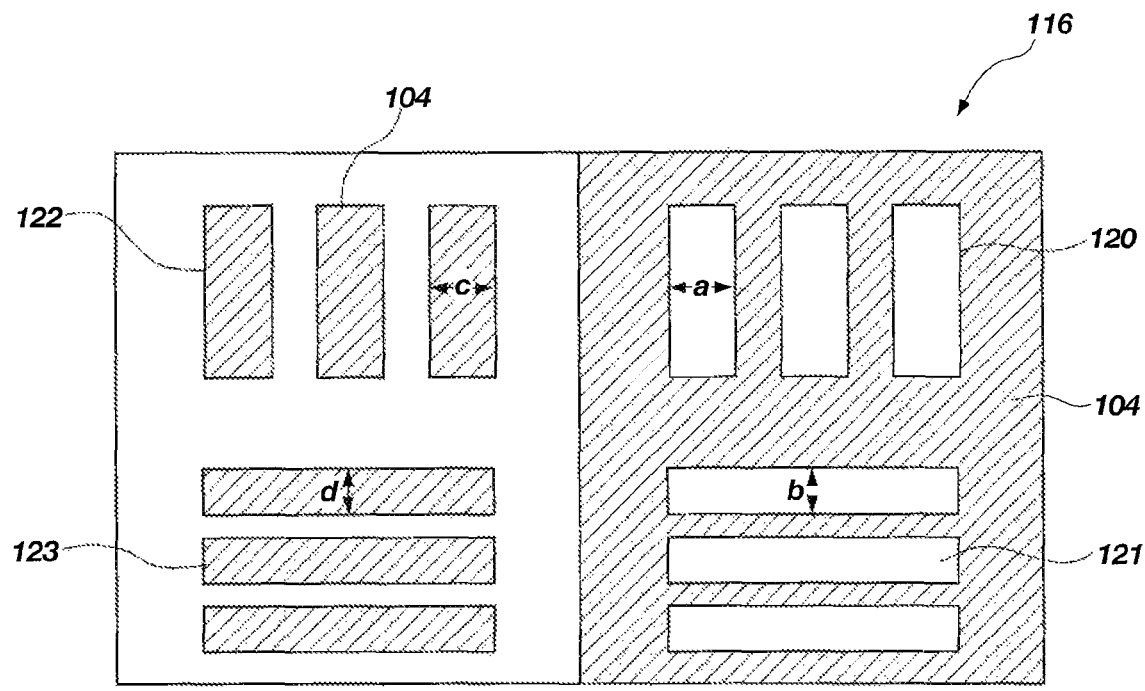
FIG. 4 is a top view of a photomask showing the clear x (a), clear y (b), dark x (c) and dark y (d) dimensions thereof.

The following are examples of the wet etch process of the present invention showing removal of portions of a chrome-containing layer of a photomask that are within the scope hereof. These examples are not meant in any way to limit the scope of this invention. (All reference numerals cited in the Examples refer to FIG. 4.)

EXAMPLES

Example I

A first photomask 116 having a plurality of substantially vertical lines 120 and a plurality of substantially lateral lines 121 etched in the chrome-containing layer 104 thereof, as well as a plurality of substantially vertical structures 122 and a plurality of substantially lateral structures 123 formed from the material of chrome-containing layer 104 itself, was subjected to a wet etch process using deionized water and ozone at a temperature of 23.5° C. and an ozone concentration of 30 mg/L. Prior to exposure, the substantially vertical lines 120 had a "clear x measurement" ranging from 0.6866 micron to 0.7054 micron, with an average of 0.6965 micron and a standard deviation of 0.0036 micron. As used herein, the term "clear x measurement" refers to the lateral distance, defined by a top view of the photomask 116, between portions of the chrome-containing layer 104 which remain subsequent to extending a substantially vertical line pattern from the photoresist material (not shown) to the chrome-containing layer 104 during fabrication of the photomask 116. The "clear x measurement" is indicated by "a" in FIG. 4. Additionally, prior to exposure, the lateral lines 121 had a "clear y measurement" ranging from 0.6936 micron to 0.7095 micron, with an average of 0.6998 micron and a standard deviation of 0.0028 micron. As used herein, the term "clear y measurement" refers to the vertical distance, defined by a top view of the photomask 116, between portions of the chrome-containing layer 104 which remain subsequent to extending a lateral line pattern from the photoresist material (not shown) to the chrome-containing layer 104 during fabrication of the photomask 116. The "clear y measurement" is indicated by "b" in FIG. 4.

The photomask 116 was placed into a solution comprising deionized water and ozone, the solution prepared by diffusing the ozone through the deionized water using a diffuser plate, for a period of about 60 minutes. Subsequently, the clear x and clear y measurements were taken to determine how much of the material comprising the chrome-containing layer 104 had been removed. At this stage, the substantially vertical lines 120 had a clear x measurement ranging from 0.6963 micron to 0.7141 micron, with an average of 0.7057 micron and a standard deviation of 0.0033 micron. Accordingly, the change in the clear x measurement ranged from 0.0075 micron to 0.0114 micron, with an average of 0.0093 micron and a standard deviation of 0.0009 micron. Further, the lateral lines 121 had a clear y measurement of 0.7035 micron to 0.7200 micron, with an average of 0.7098 micron and a standard deviation of 0.0027 micron. Accordingly, the change in the clear y measurement ranged from 0.0084 micron to 0.0118 micron, with an average of 0.100 micron and a standard deviation of 0.0008 micron.

Using these measurements, the etch rate was calculated. The clear x measurements showed an etch rate in the lateral direction ranging from $1.250 \times 10^{-4}$ microns/minute to $1.900 \times 10^{-4}$ microns/minute, with an average of $1.500 \times 10^{-4}$ microns/minute. The clear y measurements showed an etch rate in the vertical direction ranging from $1.400 \times 10^{-4}$ microns/minute to $1.966 \times 10^{-4}$ microns/minute, with an average $1.666 \times 10^{-4}$ microns/minute.

During the same experiment, the "dark x measurement" and "dark y measurement" were also taken. As used herein, the "dark x measurement" refers to the lateral dimension, defined by a top view of the photomask 116, of the substantially vertical structures 122 formed from the material of the chrome-containing layer 104 itself, which substantially vertical structures 122 themselves may define a critical dimension. The "dark x measurement" is indicated by "c" in FIG. 4. Similarly, by "dark y measurement" is meant the vertical dimension, defined by a top view of the photomask 116, of the substantially lateral structures 123 formed from the material of the chrome-containing layer 104 itself, which substantially lateral structures 123 themselves may define a critical dimension. The "dark y measurement" is indicated by "d" in FIG. 4.

Prior to exposure to the solution of deionized water and ozone, the pattern had a dark x measurement ranging from 0.4903 micron to 0.5076 micron, with an average of 0.4997 micron and a standard deviation of 0.0035 micron. Subsequent to exposure to the solution of deionized water and ozone for about 60 minutes, the pattern had a dark x measurement ranging from 0.4817 micron to 0.4986 micron, with an average of 0.4902 micron and a standard deviation of 0.0035 micron. Accordingly, the change in the dark x measurement ranged from −0.0122 micron to −0.0081 micron, with an average of −0.0095 micron and a standard deviation of −0.0007 micron.

Using these measurements, the etch rate was calculated in the lateral direction to be from $-2.033 \times 10^{-4}$ microns/minute to $-1.350-10^{-4}$ microns/minute, with an average of $-1.583 \times 10^{-4}$ microns/minute.

Prior to exposure to the solution of deionized water and ozone, the pattern had a dark y measurement ranging from 0.4926 micron to 0.5056 micron, with an average of 0.5012 micron and a standard deviation of 0.0029 micron. Subsequent to exposure to the solution of deionized water and ozone for about 60 minutes, the pattern had a dark y measurement ranging from 0.4826 micron to 0.4945 micron, with an average of 0.4896 micron and a standard deviation of 0.0022 micron. Accordingly, the change in the dark y measurement ranged from −0.0160 micron to −0.0090 micron, with an average of −0.0115 micron and a standard deviation of −0.0115 micron.

Using these measurements, the etch rate was calculated in the vertical direction to be from $-2.666 \times 10^{-4}$ microns/minute to $-1.500 \times 10^{-4}$ microns/minute, with an average of $-1.916 \times 10^{-4}$ microns/minute.

Combining the values measured from each of the clear x, clear y, dark x and dark y measurements, the average change in the material of the chrome-containing layer 104 was 0.0101 micron over the course of 60 minutes which calculates into an etch rate of $1.683 \times 10^{-4}$ microns/minute.

During this experiment, the clear x, clear y, dark x and dark y measurements were also taken after 30 minutes of exposure to the solution. The average change in the clear x measurements after 30 minutes was 0.0033 micron, the average change in the clear y measurement was 0.0050 micron, the average change in the dark x measurement was −0.0047 micron and the average change in the dark y measurement was −0.0074 micron. These values were then used to calculate the etch rate. The clear x measurement indicated an etch rate in the lateral direction of $1.100 \times 10^{-4}$ microns/minute, the clear y measurement indicated an etch rate in the vertical direction of $1.666 \times 10^{-4}$ microns/minute, the dark x measurement indicated an etch rate in the lateral direction of $-1.566 \times 10^{-4}$ microns/minute and the dark y measurement indicated an etch rate in the vertical direction of $-2.466 \times 10^{-4}$ microns/minute. The results are thus indicative of a substantially uniform removal of the chrome-containing material over the course of the exposure to the deionized water and ozone solution.

Example II

A second photomask 116 having a plurality of substantially vertical lines 120 and lateral lines 121 etched in the chrome-containing layer 104 thereof was subjected to a wet etch process using deionized water and ozone at a temperature of 23.5° C. and an ozone concentration of 30 mg/L. Prior to the wet etch, the substantially vertical lines 120 had a clear x measurement ranging from 0.6836 micron to 0.7022 micron, with an average of 0.6935 micron and a standard deviation of 0.0035 micron, and the lateral lines 121 had a clear y measurement ranging from 0.6913 micron to 0.7060 micron, with an average of 0.6974 micron and a standard deviation of 0.0028 micron.

The second photomask 116 was placed into a solution comprising deionized water and ozone, the solution prepared by diffusing the ozone through the deionized water using a diffuser plate, for a period of about 60 minutes. Subsequently, the clear x and clear y measurements were taken to determine how much of the material comprising the chrome-containing layer 104 had been removed. At this stage, the substantially vertical lines 120 had a clear x measurement ranging from 0.6963 micron to 0.7141 micron, with an average of 0.7057 micron and a standard deviation of 0.0033 micron. Accordingly, the change in the clear x measurement ranged from 0.0107 micron to 0.0143 micron, with an average of 0.0122 micron and a standard deviation of 0.0007 micron. Further, the lateral lines 121 had a clear y measurement ranging from 0.7035 micron to 0.7200 micron, with an average of 0.7098 micron and a standard deviation of 0.0027 micron. Accordingly, the change in the clear y measurement ranged from 0.0104 micron to 0.0140 micron, with an average of 0.0123 micron and a standard deviation of 0.0007 micron.

Using these measurements, the etch rate was calculated. The clear x measurements showed an etch rate in the lateral direction ranging from $1.783 \times 10^{-4}$ microns/minute to $2.383 \times 10^{-4}$ microns/minute, with an average of $2.033 \times 10^{-4}$ microns/minute. The clear y measurements showed an etch rate in the vertical direction ranging from $1.733 \times 10^{-4}$ microns/minute to $2.333 \times 10^{-4}$ microns/minute, with an average of $2.050 \times 10^{-4}$ microns/minute.

During the same experiment, the dark x measurement and dark y measurement were also taken. Prior to exposure to the solution of deionized water and ozone, the pattern had a dark x measurement ranging from 0.4932 micron to 0.5092 micron, with an average of 0.5010 micron and a standard deviation of 0.0034 micron. Subsequent to exposure to the solution of deionized water and ozone for about 60 minutes, the pattern had a dark x measurement ranging from 0.4817 micron to 0.4986 micron, with an average of 0.4902 micron and a standard deviation of 0.0035 micron. Accordingly, the change in the dark x measurement ranged from −0.0131 micron to −0.0095 micron, with an average of −0.0108 micron and a standard deviation of 0.0006 micron.

Using these measurements, the etch rate was calculated in the lateral direction to be from $-2.183 \times 10^{-4}$ microns/minute to $-1.583 \times 10^{-4}$ microns, with an average of $-1.800 \times 10^{-4}$ microns/minute.

Prior to exposure to the solution of deionized water and ozone, the pattern had a dark y measurement ranging from 0.4928 micron to 0.5047 micron, with an average of 0.5000 micron and a standard deviation of 0.0022 micron. Subsequent to exposure to the solution of deionized water and ozone for about 60 minutes, the pattern had a dark y measurement ranging from 0.4826 micron to 0.4945 micron, with an average of 0.4896 micron and a standard deviation of 0.0022 micron. Accordingly, the change in the dark y measurement ranged from −0.0118 micron to −0.0089 micron, with an average of −0.0103 micron and a standard deviation of 0.0007 micron.

Using these measurements, the etch rate was calculated in the vertical direction to be from $1.966 \times 10^{-4}$ microns/minute to $1.483 \times 10^{-4}$ microns/minute, with an average etch rate of $1,716 \times 10^{-4}$ microns/minute.

Combining the values measured from each of the clear x, clear y, dark x and dark y measurements, the average change in the material of the chrome-containing layer 104 was 0.0114 micron over the course of 60 minutes, which calculates into an etch rate of $1.900 \times 10^{-4}$ microns/minute.

The method of the present invention may be used to adjust dimensions of photomask features subsequent to etching of a defective pattern of such features in the chrome-containing layer thereof. The method provides a way in which dimensions may be adjusted by a small amount to more closely achieve a desired critical dimension, even if within the critical dimension tolerance, or to salvage a photomask previously thought to be unsalvageable and which was, accordingly, routinely discarded. This may result in a potentially substantial cost savings. Dimensions may be adjusted in both lateral and vertical directions using the method of the present invention and, depending on the length of exposure to the deionized water and ozone solution, may be adjusted on the order of a few angstroms to 20-30 nanometers, or more.

The invention defined by the appended claims is not to be limited by particular details set forth in the above description and that other and further embodiments will become apparent to those of ordinary skill in the art to which the present invention pertains without departing from the spirit and scope thereof.

What is claimed is:

1. A method for removing material from a chrome-containing layer of a photomask, comprising:
   exposing a chrome-containing layer of a photomask formed over a substrate and having at least one defect therein to a wet etch solution comprising deionized water and ozone; and
   removing portions of the chrome-containing layer having the at least one defect therein with the wet etch solution such that underlying portions of the substrate are exposed and the at least one defect is removed.

2. The method of claim 1, wherein exposing a chrome-containing layer of a photomask formed over a substrate and having at least one defect therein to a wet etch solution comprising deionized water and ozone comprises providing the photomask having a defective pattern in the chrome-containing layer.

3. The method of claim 1, wherein exposing a chrome-containing layer of a photomask formed over a substrate and having at least one defect therein to a wet etch solution comprising deionized water and ozone comprises exposing the chrome-containing layer to the wet etch solution comprising ozone at a concentration of from about 30 mg/L to about 35 mg/L.

4. The method of claim 1, wherein exposing a chrome-containing layer of a photomask formed over a substrate and having at least one defect therein to a wet etch solution comprising deionized water and ozone comprises exposing the chrome-containing layer to the wet etch solution at a temperature of between about 20° C. and about 30° C.

5. The method of claim 1, wherein exposing a chrome-containing layer of a photomask formed over a substrate and having at least one defect therein to a wet etch solution comprising deionized water and ozone comprises exposing the chrome-containing layer to the wet etch solution at a temperature of about 23.5° C.

6. The method of claim 1, wherein exposing a chrome-containing layer of a photomask formed over a substrate and having at least one defect therein to a wet etch solution comprising deionized water and ozone comprises exposing the chrome-containing layer to a wet etch solution consisting essentially of deionized water and ozone.

7. The method of claim 1, wherein exposing a chrome-containing layer of a photomask formed over a substrate and having at least one defect therein to a wet etch solution comprising deionized water and ozone comprises exposing the chrome-containing layer to the wet etch solution for a period of time sufficient to remove the at least one defect from the chrome-containing layer.

8. The method of claim 1, wherein removing portions of the chrome-containing layer having the at least one defect therein with the wet etch solution such that underlying portions of the substrate are exposed and the at least one defect is removed comprises adjusting a first dimension of the at least one defect to a second dimension more closely approximating a desirable value than the first dimension.

9. The method of claim 1, wherein exposing a chrome-containing layer of a photomask formed over a substrate and having at least one defect therein to a wet etch solution comprising deionized water and ozone comprises exposing the chrome-containing layer to the wet etch solution for a period of time sufficient to adjust a first dimension of the at least one defect to a second dimension more closely approximating a desirable value than the first dimension.

10. A method for removing material from a chrome-containing layer of a photomask, comprising:

exposing a chrome-containing layer of a photomask to a solution comprising deionized water and ozone, the chrome-containing layer having at least one defect therein; and removing the at least one defect.

11. A method for removing material from a chrome-containing layer of a photomask, comprising:

exposing a chrome-containing layer of a photomask to a solution comprising deionized water and ozone, the chrome-containing layer having at least one defect therein; and etching the chrome-containing layer to remove the at least one defect.

\* \* \* \* \*